(12) United States Patent
Gibson et al.

(10) Patent No.: US 9,716,224 B2
(45) Date of Patent: Jul. 25, 2017

(54) MEMRISTOR DEVICES WITH A THERMALLY-INSULATING CLADDING

(71) Applicant: Hewlett Packard Enterprise Development LP, Houston, TX (US)

(72) Inventors: Gary Gibson, Palo Alto, CA (US); Richard Henze, Palo Alto, CA (US); Warren Jackson, Palo Alto, CA (US); Yoocharn Jeon, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/114,973

(22) PCT Filed: Mar. 7, 2014

(86) PCT No.: PCT/US2014/021598
§ 371 (c)(1),
(2) Date: Jul. 28, 2016

(87) PCT Pub. No.: WO2015/134035
PCT Pub. Date: Sep. 11, 2015

(65) Prior Publication Data
US 2016/0343938 A1    Nov. 24, 2016

(51) Int. Cl.
*G11C 11/00* (2006.01)
*H01L 45/00* (2006.01)
(Continued)

(52) U.S. Cl.
CPC ........ *H01L 45/1293* (2013.01); *G11C 13/004* (2013.01); *G11C 13/0069* (2013.01); *H01L 27/2418* (2013.01); *H01L 45/04* (2013.01); *H01L 45/08* (2013.01); *H01L 45/085* (2013.01); *H01L 45/1233* (2013.01); *H01L 45/1266* (2013.01); *H01L 45/145* (2013.01); *H01L 45/146* (2013.01); *G11C 2013/0095* (2013.01)

(58) Field of Classification Search
USPC ......................................... 365/148, 163, 174
See application file for complete search history.

(56) References Cited

U.S. PATENT DOCUMENTS 3,641,522 A    2/1972  Maegawa et al.
5,682,041 A    10/1997 Kawakubo et al.
(Continued)

FOREIGN PATENT DOCUMENTS

JP    2010287683 A    12/2010

OTHER PUBLICATIONS

Ali Shakouri, "Nanoscale Thermal Transport and Microrefrigerators on a Chip", IEEE, Vo. 94, No. 8, Aug. 2006, pp. 1613-1638.
(Continued)

*Primary Examiner* — Vu Le
(74) *Attorney, Agent, or Firm* — Hewlett Packard Enterprise Patent Department (57) ABSTRACT

A memristor device with a thermally-insulating cladding includes a first electrode, a second electrode, a memristor, and a thermally-insulating cladding. The memristor is coupled in electrical series between the first electrode and the second electrode. The thermally-insulating cladding surrounds at least a portion of the memristor.

14 Claims, 9 Drawing Sheets

(51) Int. Cl.
*G11C 13/00* (2006.01)
*H01L 27/24* (2006.01)

(56) References Cited

U.S. PATENT DOCUMENTS

| | | | |
|---|---|---|---|
| 6,118,136 | A | 9/2000 | Liu et al. |
| 7,355,885 | B2 | 4/2008 | Fukuzumi |
| 7,531,850 | B2 | 5/2009 | Blanchard |
| 7,615,770 | B2 | 11/2009 | Philipp et al. |
| 2010/0252796 | A1 | 10/2010 | Noshiro |
| 2011/0001110 | A1 | 1/2011 | Takahashi |
| 2011/0002154 | A1 | 1/2011 | Mitani et al. |
| 2011/0017977 | A1 | 1/2011 | Bratkovski et al. |
| 2011/0193050 | A1 | 8/2011 | Takano et al. |
| 2011/0198554 | A1 | 8/2011 | Iijima et al. |
| 2011/0240951 | A1 | 10/2011 | Yang et al. |
| 2012/0104346 | A1 | 5/2012 | Yi et al. |
| 2013/0009128 | A1* | 1/2013 | Ribeiro ............... H01L 27/2463 257/9 |
| 2013/0100727 | A1 | 4/2013 | Ordentlich et al. |
| 2013/0103888 | A1 | 4/2013 | Ordentlich et al. |
| 2014/0027705 | A1 | 1/2014 | Yang et al. |
| 2014/0167042 | A1* | 6/2014 | Yang .................... H01L 45/08 257/43 |
| 2014/0346426 | A1* | 11/2014 | Miao .................... H01L 45/08 257/3 |

OTHER PUBLICATIONS

Ali Shakouri, et al., "On-Chip Solid-State Cooling for Integrated Circuits Using Thin-Film Microrefrigerators", IEEE, vol. 28, No. 1, Mar. 2005, pp. 65-69.
Fujiwara, H, et al., A 7T/14T Dependable SRAM and Its Array Structure to Avoid Half Selection [online], Mar. 3, 2009, Retrieved from the Internet, 6 Pgs.
International Searching Authority, The International Search Report and the Written Opinion, PCT/US2014/021598, Dec. 5, 2014, 11 Pgs.
Shiou-Ying Cheng, et al. , "Superlatticed negataive differential-resistance heterojunction bipolar transistor", IEEE, vol. 17, No. 4, Jul./Aug. 1999, pp. 1477-1481.
Unknown, "Ellingham Diagrams", Retrieved Nov. 21, 2016, 4 Pgs.
Yan Zhang, et al., "Enhanced Hot Spot Cooling Using Bonded Superlattice Microcoolers With a Trench Structure", IEEE, vol. 31, No. 3, Sep. 2008, pp. 552-558.
Yan Zhang, et al., "On-Chip High Speed Localized Cooling Using Superlattice Microrefrigerators", IEEE, vol. 29, No. 2, Jun. 2006, pp. 395-401.

* cited by examiner

MEMRISTOR DEVICES WITH A THERMALLY-INSULATING CLADDING

BACKGROUND

Memristors are devices that can be programmed to different resistive states by applying a programming energy, such as a voltage. After programming, the state of the memristor can be read and remains stable over a specified time period. Thus, memristors can be used to store digital data. For example, a high resistance state can represent a digital "0" and a low resistance state can represent a digital "1." Large crossbar arrays of memristive elements can be used in a variety of applications, including random access memory, non-volatile solid state memory, programmable logic, signal processing control systems, pattern recognition, and other applications.

BRIEF DESCRIPTION OF THE DRAWINGS

The following detailed description references the drawings, wherein.

DETAILED DESCRIPTION

Memristors are nano-scale devices that may be used as a component in a wide range of electronic circuits, such as memories, switches, radio frequency circuits, and logic circuits and systems. In a memory structure, a crossbar array of memristor devices may be used. When used as a basis for memories, memristors may be used to store bits of information, 1 or 0. When used as a logic circuit, a memristor may be employed as configuration bits and switches in a logic circuit that resembles a Field Programmable Gate Array, or may be the basis for a wired-logic Programmable Logic Array. It is also possible to use memristors capable of multi-state or analog behavior for these and other applications.

The resistance of a memristor may be changed by applying a voltage across or a current through the memristor. Generally, at least one channel may be formed that is capable of being switched between two states—one in which the channel forms an electrically conductive path ("ON") and one in which the channel forms a less conductive path ("OFF"). In some cases, conducting channels may be formed by ions and/or vacancies. Some memristors exhibit bipolar switching, where applying a voltage of one polarity may switch the state of the memristor and where applying a voltage of the opposite polarity may switch back to the original state. Alternatively, memristors may exhibit unipolar switching, where switching is performed, for example, by applying different voltages of the same polarity.

Using memristors in crossbar arrays may lead to read and/or write failure due to sneak currents passing through the cells that are not selected—for example, cells on the same row or column as a targeted cell. Failure may arise when the total current from an applied voltage is higher than the current through the targeted memristor due to current sneaking through untargeted neighboring cells. As a result, effort has been spent on minimizing sneak currents. Using a transistor with each memristor has been proposed to isolate each cell and overcome the sneak current. However, using a transistor with each memristor in a crossbar array limits array density and increases cost, which may impact the commercialization of memristor devices.

Examples disclosed herein provide for thermally-insulated memristor devices. In example implementations, a memristor device includes a memristor coupled in electrical series between at least two electrodes and a thermally-insulating cladding surrounding a portion of the memristor. Insulating the memristor may raise its temperature when a voltage or current is applied—such as during writing—due to joule heating. Joule heating, also known as resistive heating, generally occurs when heat is released by a material as the result of a current passing through the material. Typically, a larger voltage creates a larger current through the material, which causes a larger amount of heat to be released by the conductor.

In this manner, the example memristor devices disclosed herein may exhibit accelerated switching. In some cases, switching of a memristor may be influenced by the temperature of the memristor. Without adhering to any particular theory, processes which drive ionic and electronic motion—including drift, thermophoresis, and diffusion—accelerate with increasing temperature. Thus, raising the temperature of the memristor may influence switching speed of the memristor device, which, among other features, may allow for reducing the amount of time required for application of a programming bias via a voltage or current. Accordingly, increasing the switching speed may mitigate errors and improve operation efficiency.

Figure 1A:
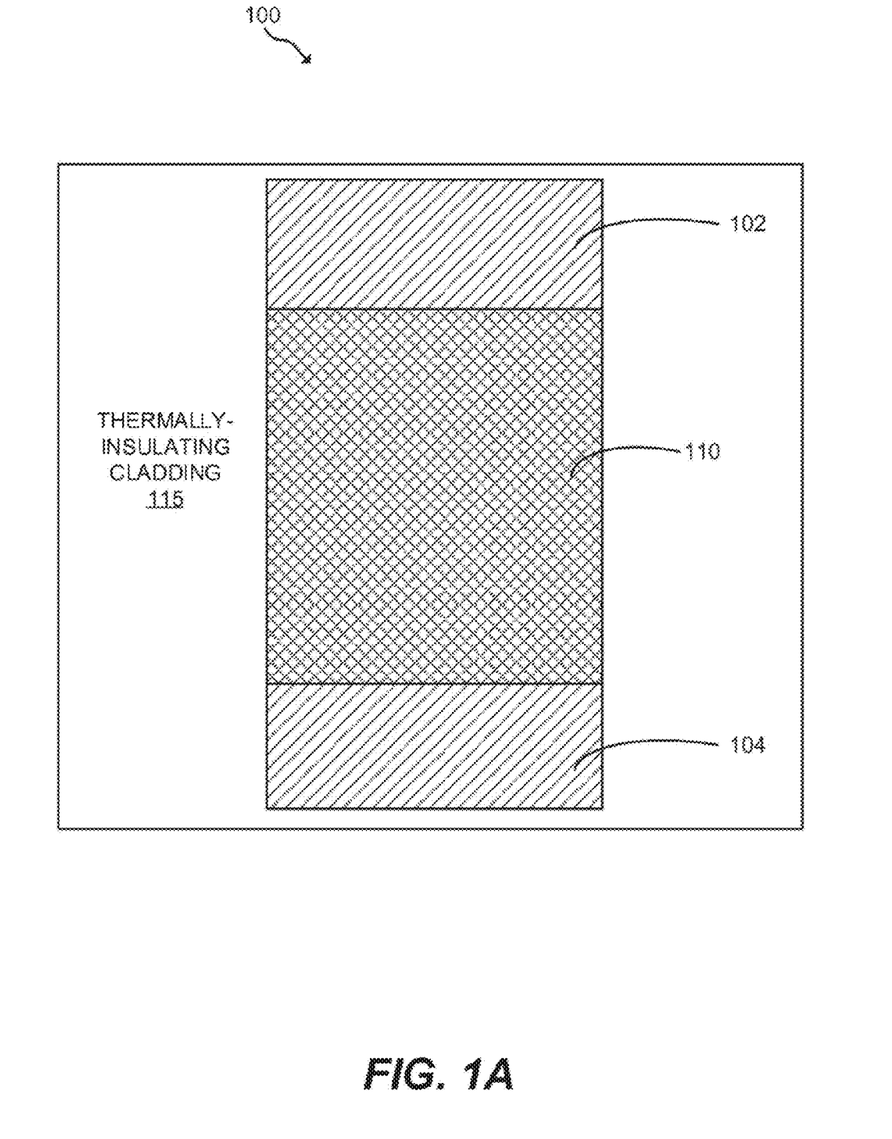
FIG. 1A is a cross-sectional view of an example memristor device having a thermally-insulating cladding surrounding an memristor.

Referring now to the drawings, FIG. 1A depicts an example memristor device 100 having an memristor 110 coupled in electrical series between a first electrode 102 and a second electrode 104 and having a thermally-insulating cladding 115 surrounding memristor 110. Generally, memristor device 100 may have a continuous electrical path so current may travel through first electrode 102, memristor 110, and second electrode 104. The resistance of memristor 100 may change with an applied voltage across or current through memristor 110. Furthermore, memristor 100 may "memorize" its last resistance. In this manner, memristor device 100 may be set to at least two states. Memristor device 100 may, for example, be a single memory cell in a crossbar array of multiple memory cells. Such an array of memristor devices 100 may, for example, be utilized in nonvolatile resistive memory, such as resistive random access memory (RRAM).

Memristor 110 may have a material that exhibits switching behavior. Accordingly, memristor 110 may provide for switching the resistance of memristor device 100. In some implementations, the switching behavior of memristor 110 may be influenced by temperature. For example, switching speed of memristor 110 may increase with increasing temperature. In some examples, portions of memristor device 100 may experience joule heating, including memristor 110, first electrode 102, second electrode 104, and thermally-insulating cladding 115. Furthermore, memristor 110 may include a material that decreases in resistance with increasing temperature.

Memristor 110 may be based on a variety of materials. Memristor 110 may be oxide-based, meaning that at least a portion of the memristor is formed from an oxide-containing material. Memristor 110 may also be nitride-based, meaning that at least a portion of the memristor is formed from a nitride-containing composition. Furthermore, memristor 110 may be oxy-nitride based, meaning that a portion of the memristor is formed from an oxide-containing material and that a portion of the memristor is formed from a nitride-containing material. In some examples, memristor 110 may be formed based on tantalum oxide ($TaO_x$) or hafnium oxide ($HfO_x$) compositions. Other example materials of memristor 110 may include titanium oxide, yttrium oxide, niobium oxide, zirconium oxide, or other like oxides, or non-transition metal oxides, such as aluminum oxide, calcium oxide, magnesium oxide, dysprosium oxide, lanthanum oxide, silicon dioxide, or other like oxides. Further examples include nitrides, such as aluminum nitride, gallium nitride, tantalum nitride, and silicon nitride. In addition, other functioning memristors may be employed in the practice of the teachings herein.

Thermally-insulating cladding 115 may surround at least a portion of memristor 110. In some implementations, such as the example depicted in FIG. 1A, thermally-insulating cladding 115 may fully surround memristor device 100. In other examples, thermally-insulating cladding 115 may surround memristor 110 and no other components. Thermally-insulating cladding 115 may have low thermal conductivity and may therefore provide thermal insulation to memristor 110. In particular, memristor 110 may heat up faster, and/or reach higher temperatures, when a voltage or current is applied due to retention of heat released by joule heating due to insulation provided by thermally-insulating cladding 115. Additionally, thermally-insulating cladding 115 may itself release heat due to joule heating, which may contribute to raising the temperature of memristor 110.

Thermally-insulating cladding 115 may include a variety of thermally-insulating materials. In some examples, thermally insulating cladding 115 may also be electrically insulating. Electrical insulation of thermally-insulating cladding 115 may prevent interference with the switching or reading of memristor 110 other than by thermal influence. Non-limiting example materials for thermally-insulating cladding 115 may include silicon dioxide ($SiO_2$), silicon nitride ($Si_3N_4$) and ternary variants, various glasses, metal oxides, or nitrides.

First electrode 102 and second electrode 104 may have low thermal conductivity. First electrode 102 and second electrode 104 with low thermal conductivity may provide thermal insulation to memristor 110. In particular, memristor 110 may heat up faster or reach higher temperatures when a voltage or current is applied due to retention of heat released by joule heating due to thermal insulation provided by first electrode 102 and second electrode 104. Generally, first electrode 102 and second electrode 104 may have high electrical conductivity.

In some examples, first electrode 102 and second electrode 104 may include the same material. In other examples, first electrode 102 and second electrode 104 may each include a different material. Non-limiting example materials for first electrode 102 and second electrode 104 include titanium nitride (TiN), tantalum nitride (TaN and/or $Ta_2N$), tungsten nitride ($WN_2$), niobium nitride (NbN), molybdenum (MoN), titanium silicide (TiSi, $TiSi_2$, $Ti_5Si_3$), tantalum silicide ($TaSi_2$), tungsten silicide ($WSi_2$), niobium silicide ($NbSi_2$), vanadium silicide ($V_3Si$), electrically doped silicon polycrystalline, and electrically doped germanium polycrystalline. First electrode 102 and second electrode 104 may, in some examples, be a part of thermally-insulating cladding 115.

Figure 1B:
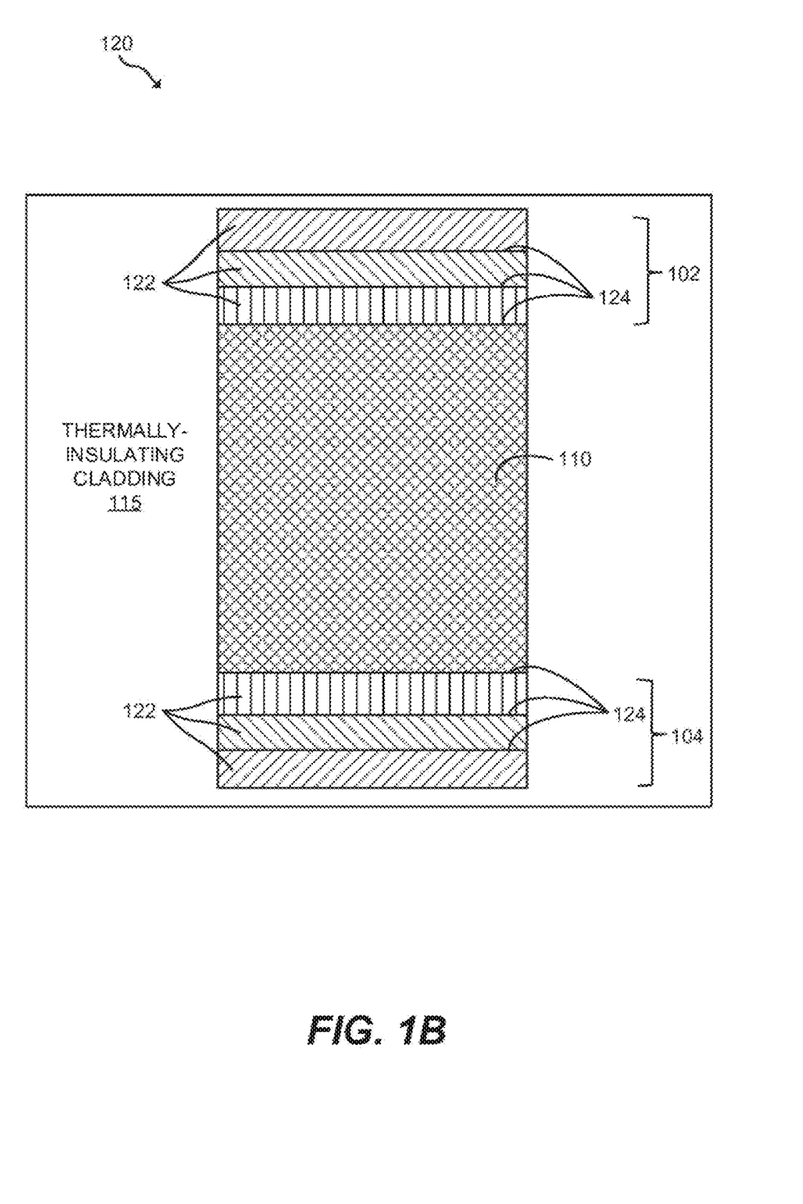
FIG. 1B is a cross-sectional view of an example memristor device having electrodes with multiple layers.

FIG. 1B depicts an example memristor device 120 which includes memristor device 100 and where at least one of first electrode 102 and electrode 104 has multiple layers 122, wherein layers 122 form an interface 124. In some examples, one of first electrode 102 and second electrode 104 have more than one layer 122. In others, both have multiple layers 122. For each layer 122, at least one interface 124 is formed between layer 122 and another layer 122 or memristor 110 depending on the location of layer 122. In the example depicted in FIG. 1B, first electrode 102 and second electrode 104 each possess three layers 122 each forming three interfaces 124. It should be understood that there are many variations of memristor device 120, but FIG. 1B depicts an example that serves the purpose of illustration.

Layers 122 may have the same materials. Alternatively, each layer 122 may include a different material. In other implementations, some layers 122 may share the same material and have different materials from other layers 122. Non-limiting example materials for layer 122 include titanium nitride (TiN), tantalum nitride (TaN and/or $Ta_2N$), tungsten nitride ($WN_2$), niobium nitride (NbN), molybdenum (MoN), titanium silicide ($TiSi_2$, $Ti_5Si_3$), tantalum silicide ($TaSi_2$), tungsten silicide ($WSi_2$), niobium silicide ($NbSi_2$), vanadium silicide ($V_3Si$), electrically doped silicon polycrystalline, and electrically doped germanium polycrystalline.

Interface 124 may be a physical contact formed by the electrical coupling between layers 122 and between a layer 122 and memristor 110. Interface 124 may have an interfacial thermal resistance (also known as Kapitza resistance). Without subscribing to any particular theory, an interfacial thermal resistance may be caused by a phononic mismatch between a material of a layer 122 and a material of the element to which layer 122 is coupled. The thermal resistance of interface(s) 124 may provide increased thermal insulation to memristor 110. In particular, memristor 110 may heat up faster or reach higher temperatures when a voltage or current is applied due to retention of heat released by joule heating due to thermal insulation provided by interface 124.

Figure 1C:
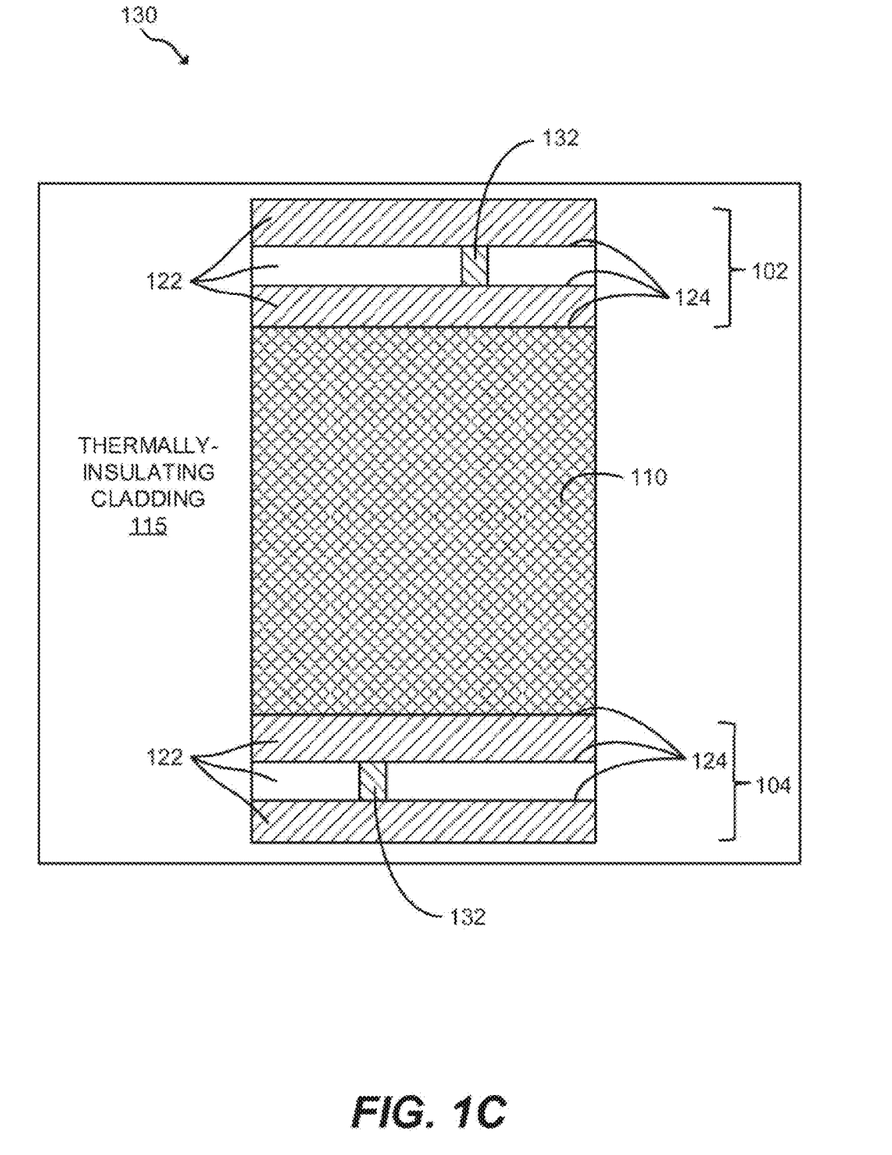
FIG. 1C is a cross-sectional view of an example memristor device having electrodes with multiple layers, where at least one layer is electrically insulating and has an electrical short.

FIG. 1C depicts an example memristor device 130 which includes memristor device 120 with at least one of first electrode 102 and second electrode 104 having multiple layers 122, where at least one layer 122 is electrically insulating and has an electrical short 132. Generally, many thermally insulating materials are also electrically insulating. Therefore, in such instances, electrical short 132 may provide an electrically conducting path through a layer 122 that is electrically insulating. In the example depicted in FIG. 1C, first electrode 102 and second electrode 104 each have three layers 122 with one layer 122 having an electrically insulating material sandwiched between two layers 122 that are electrically conducting. Each of the electrically insulating layers 122 includes an electrical short 132. In other examples, there may be multiple layers 122 that are electrically insulating with multiple electrical shorts 132. It should be understood that there are many variations of memristor device 130, but FIG. 1C depicts an example that serves the purpose of illustration.

Electrical short 132 may provide an electrically conducting path through layer 122. In some examples, there may one electrical short 132 for each layer 122. In others, there may be multiple electrical shorts 132. Electrical shorts 132 may be placed at various locations within each layer 122. For an example, one electrical short 132 may be located at one end of layer 122 and another electrical short 132 may be located at the opposite end of a nearby layer 122. A layer 122 that is electrically conducting may sandwich two layers 122 that are electrically insulating, or vice versa. This alternating structure may maximize the length of the electrical path through first electrode 102 and/or second electrode 104. Accordingly, joule heating may be boosted by increasing the conducting path of the electrodes.

A layer 122 that is electrically insulating may include a number or materials. Non-limiting example materials for an electrically insulating layer 122 include silicon dioxide ($SiO_2$), silicon nitride ($Si_3N_4$) and ternary variants, metal oxides, nitrides, various glasses, various gases, or vacuum.

Figure 1D:
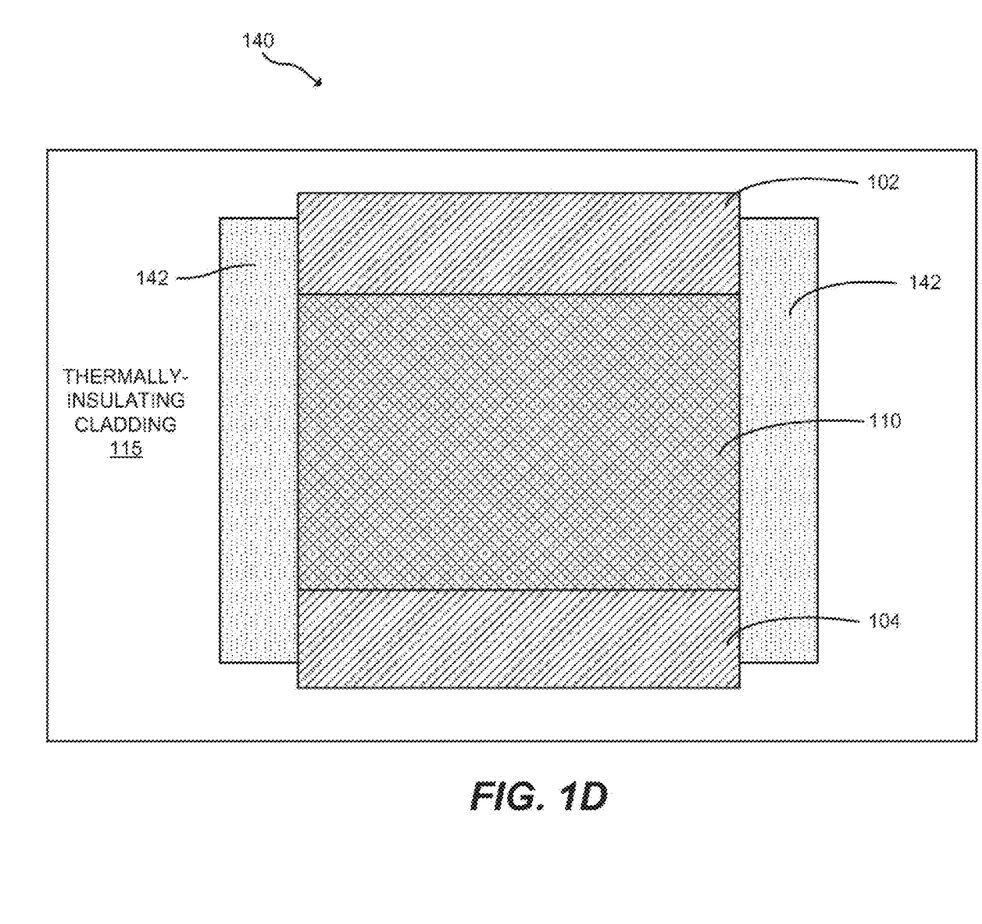
FIG. 1D is a cross-sectional view of an example memristor device having an air-gap surrounding a memristor.

FIG. 1D depicts an example memristor device 140 which includes memristor device 100 and an air-gap 142 surrounding a portion of memristor 110. In some examples, air-gap 142 may be between memristor 110 and thermally-insulating cladding 115. In other examples, air-gap 142 may be a part of thermally-insulating cladding 115. Air-gap 142 may partially surround memristor 110 or fully surround except for the axial contact to electrodes 102 or 104. In some implementations, air-gap 142 may also partially surround other elements of memristor device 140, including first electrode 102 and second electrode 104. It should be understood that there are many variations of memristor device 140, but FIG. 1D depicts an example that serves the purposes of illustration.

Air-gap 142 may include a variety of gaseous materials. In one example, air-gap 142 may include substantially no materials, forming a vacuum. Alternatively, air-gap 142 may include a thermally-insulating gas, including, but not limited to atmospheric air, nitrogen ($N_2$), and/or other inert gases. Accordingly, air-gap 142 may provide thermal insulation to memristor 110. In particular, memristor 110 may heat up faster or reach higher temperatures when a voltage or current is applied due to retention of heat released by joule heating due to insulation provided by air-gap 142.

Figure 1E:
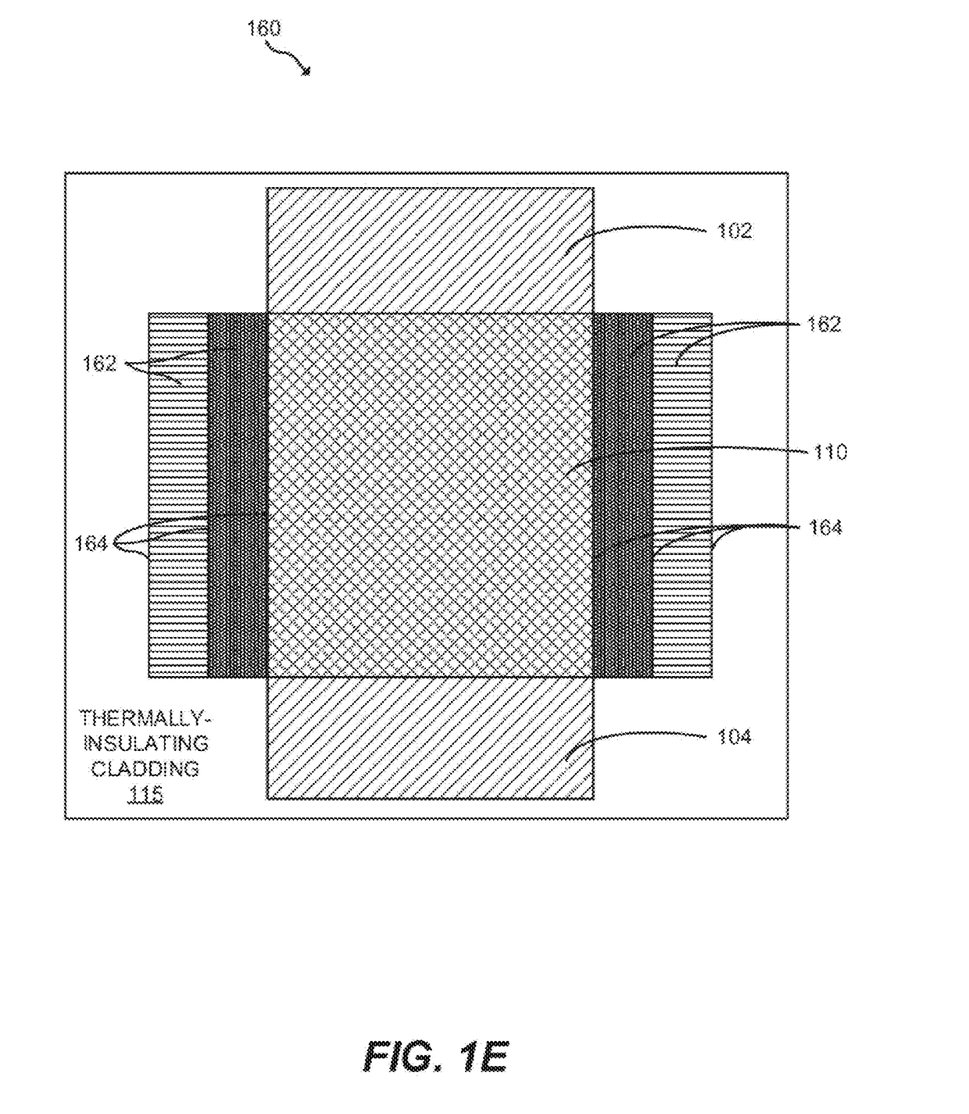
FIG. 1E is a cross-sectional view of an example memristor device having a thermally-insulating cladding with a plurality of layers.

FIG. 1E depicts an example memristor device 160 which includes memristor 100 where thermally-insulating cladding 115 includes a plurality of layers 162 forming at least one interface 164. Each layer 162 may have a different size or layers 162 may have the same size. In some examples with multiple layers 162, more than one layer 162 may form an interface 164 with memristor 110. It should be understood that there are many variations of memristor device 160, but FIG. 1E depicts an example that serves the purpose of illustration. In the example depicted in FIG. 1E, thermally-insulating cladding 115 includes two layers 162. A first layer 162 forms a first interface 164 with memristor 110. A second layer 162 forms a second interface 164 with first layer 162.

Each layer 162 may have the same material or a different material. Non-limiting example materials for layer 162 include silicon dioxide ($SiO_2$), silicon nitride ($Si_3N_4$) and ternary variants, metal oxides, nitrides, various glasses, various gases, or vacuum.

Interface 164 may be a physical contact formed between each layer 162 or between layer 162 and memristor 110. Similar to interface 124 of FIG. 1B, interface 164 may have an interfacial thermal resistance (Kapitza resistance). Without subscribing to any particular theory, an interfacial thermal resistance may be caused by a phononic mismatch between two or more materials. The interfacial thermal resistance of interface 164 may provide thermal insulation to memristor 110. In particular, memristor 110 may heat up faster or reach higher temperatures when a voltage or current is applied due to retention of heat released by joule heating due to insulation provided by interface 164. In some implementations, each layer 162 has a different material that forms an interfacial thermal resistance for each interface 164.

FIG. 1 depicts an example memristor device 180 which includes memristor device 100 and a selector 182 coupled in electrical series to memristor 110. Selector 182 may be an electrical component with nonlinear current voltage characteristics. Selector 182 may improve the use of memristor device 180 as an element in a crossbar memory array by suppressing sneak currents. In some examples, memristor device 180 may have more than one selector 182 coupled in electrical series with memristor 110. It should be understood that there are many variations of memristor device 180, but FIG. 1F depicts an example that serves the purpose of illustration.

Figure 1F:
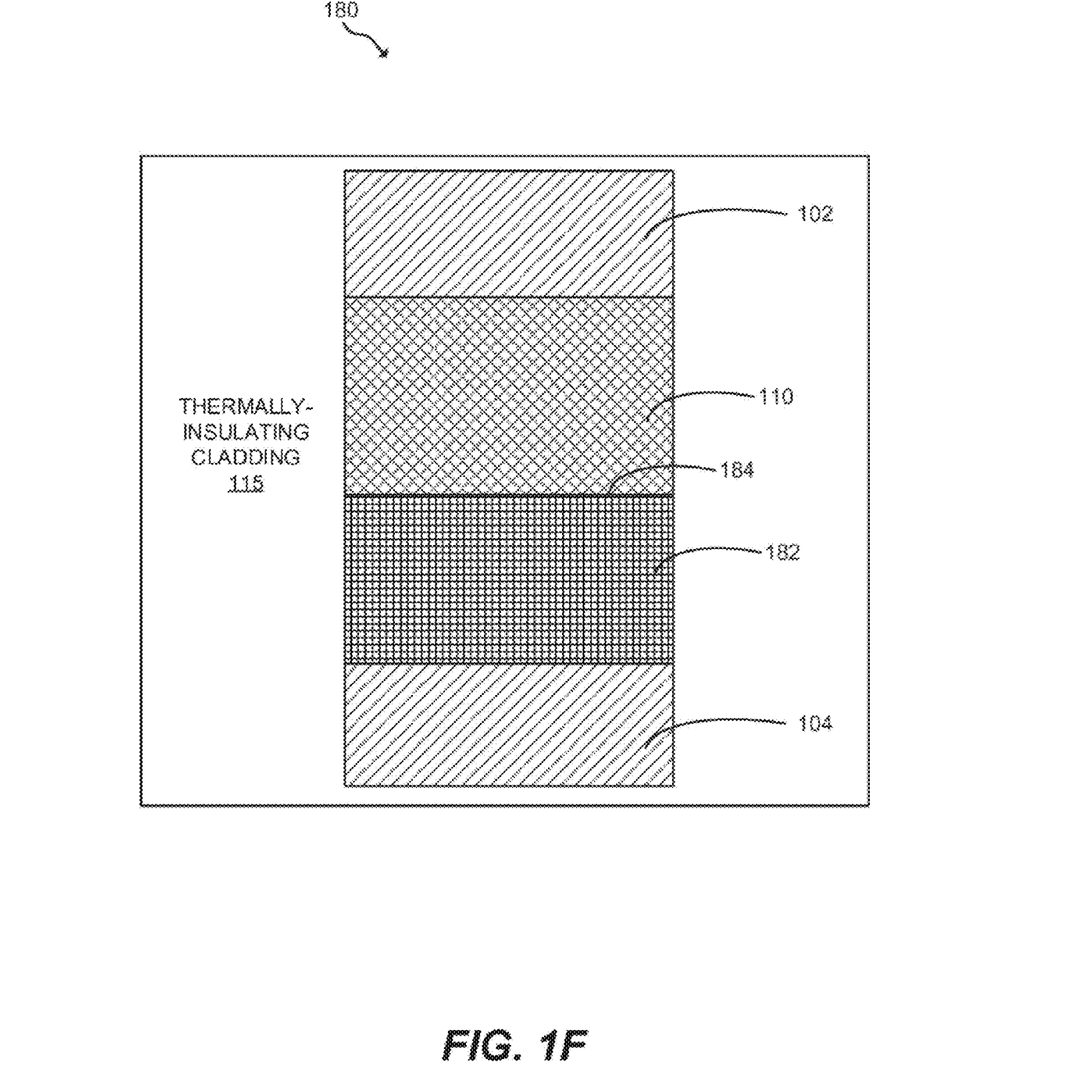
FIG. 1F is a cross-sectional view of an example memristor device having a selector in electrical series with a memristor.

Selector 182 may exhibit joule heating with application of a voltage across or a current through selector 182. The heat released by selector 182 may raise the temperature of memristor 110. In particular, memristor 110 may heat up faster or reach higher temperatures when a given voltage or current is applied due to extra heat provided by joule heating of selector 182 via the same applied voltage. Furthermore, selector 182 may form an interface 184, which may be a physical contact between selector 182 and memristor 110. Similar to interface 124 of FIG. 1B, interface 184 may have an interfacial thermal resistance (Kapitza resistance) which provides thermal insulation to memristor 110.

Selector 182 may include one or more of a variety of materials. For example, selector 182 may have a metal oxide. Non-limiting examples of the metal in these me oxides include tantalum (Ta), hafnium (Hf), zirconium (Zr), aluminum (Al), cobalt (Co), nickel (Ni), iron (Fe), niobium (Nb), molybdenum (Mo), tungsten (W), copper (Cu), magnesium (Mg), calcium (Ca), and titanium (Ti). In other examples, selector 182 may include a metal nitride.

Figure 2:
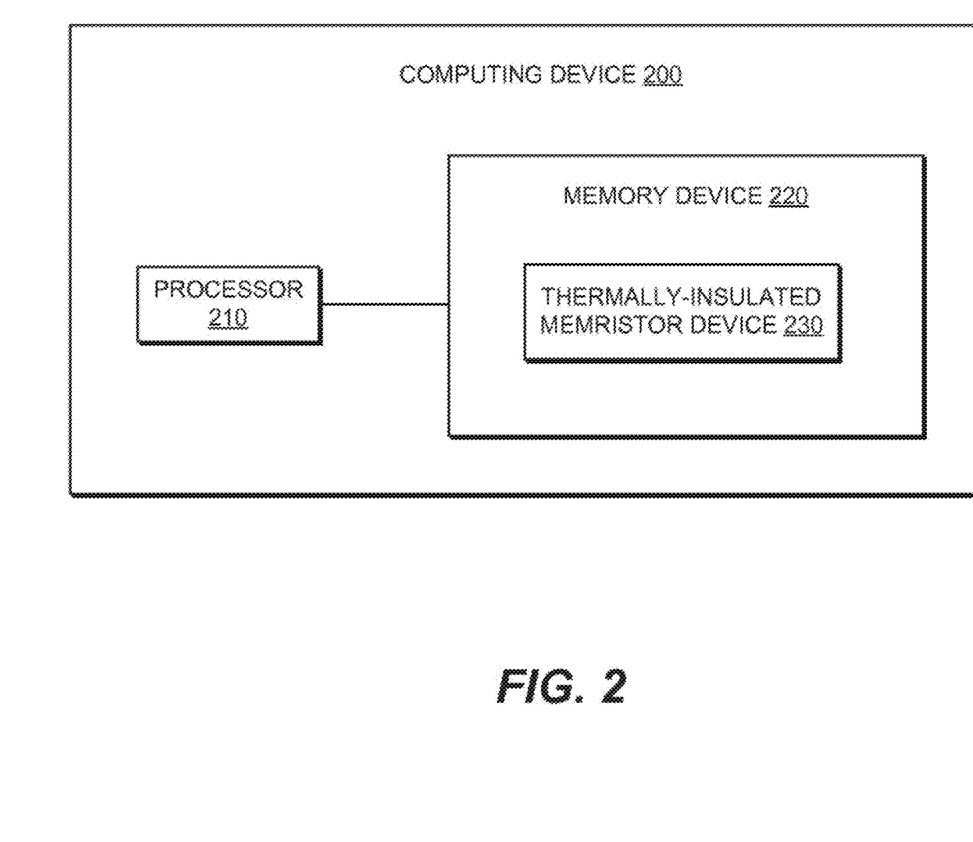
FIG. 2 is a block diagram of an example computing device having a memory device that includes a thermally-insulated memristor device.

FIG. 2 depicts a block diagram depicting example computing device 200 having a memory device 220 that includes a thermally-insulated memristor device 230. Computing device 200 may be, for example, a notebook or desktop computer, a mobile device, a local area network (LAN) server, a web server, a cloud-hosted server, or any other electronic device that may utilize a memory device or other component having a memristor. In the implementation of FIG. 2, computing device 200 includes a processor 210.

Processor 210 may be one or more central processing units (CPUs), semiconductor-based microprocessors, and/or other hardware devices suitable for retrieval and execution of instructions stored in memory device 220 and/or another memory device. Memory device 220 may be, for example, random access memory, machine-readable storage medium, or another form of computer data storage. Memory device 220 may have a number of memristor devices 230 that may operate as the storage elements. The switching of memristor device 230 between two states allows the representation of a bit, namely a "0" or "1". For example, memory device 220 may include one or more dense crossbar arrays of memristor devices 230.

Memristor device 230 may have a memristor that exhibits switching behavior. Accordingly, the memristor may provide for switching the resistance of memristor device 230. In some implementations, the switching behavior of the memristor may be influenced by temperature. For example, switching speed of the memristor may increase with increasing temperature.

Figure 3A:
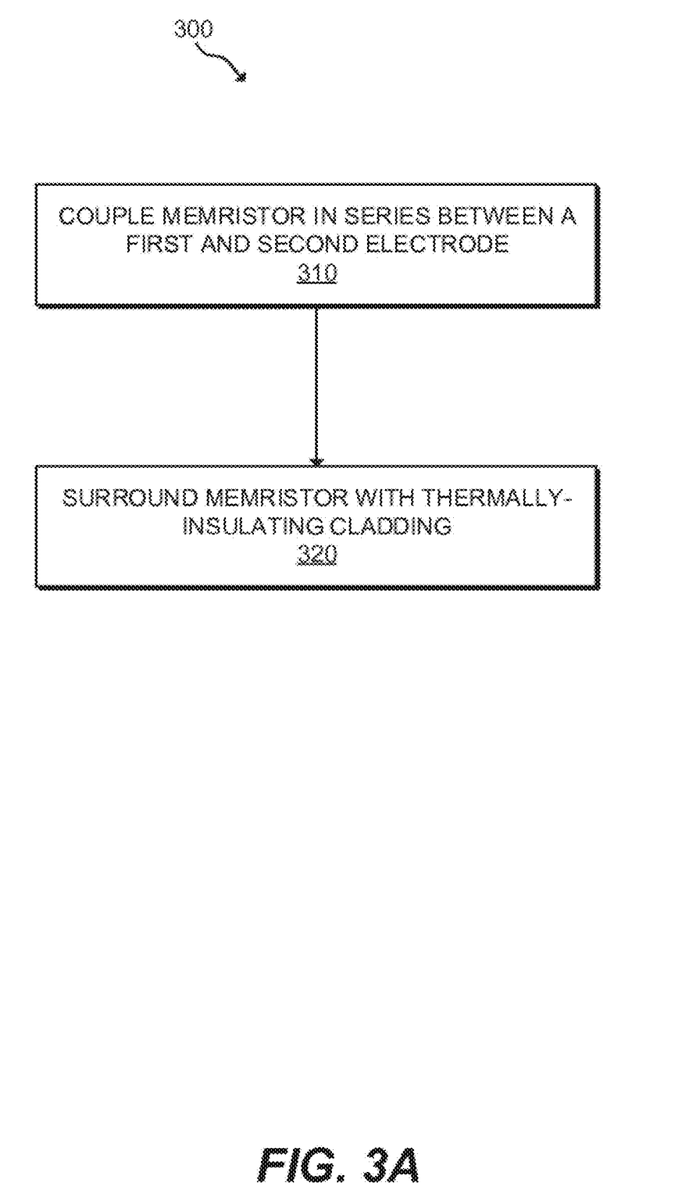
FIG. 3A is a flowchart of an example method for improving performance of a memristor device.

FIG. 3A depicts a flowchart of an example method 300 for improving performance of a memristor, which may include step 310 for coupling an memristor in electrical series between a first and second electrode and step 320 for surrounding the memristor with a thermally-insulating cladding. Applying an electrical stimulus, such as a voltage or current, to the memristor may generate heat. Although the execution of method 300 is described in reference to improving the performance of memristor device 100 of FIG. 1A, other suitable parties for implementation of method 300 will be apparent, including, but not limited to, memristor device 120 of FIG. 1B, memristor device 130 of FIG. 1C, memristor device 140 of FIG. 1D, memristor device 160 of FIG. 1E, and memristor device 180 of FIG. 1F.

Method 300 may start in block 310, where memristor 110 is coupled in electrical series between first electrode 102 and second electrode 104. Coupling may mean an electrically-conducting connection between elements. For example, memristor 110 may be placed in physical contact between first electrode 102 and second electrode 104, forming a conducting path through the three elements. As described in detail above, memristor 110 may have a material that exhibits switching behavior. Accordingly, memristor 110 may provide for switching the resistance of memristor device 100. Similarly, first electrode 102 and second electrode 104 may include a variety of materials. Furthermore, in some examples, at least one of first electrode 102 and second electrode 104 may have more than one layers 122 that form additional interfaces 124. Alternatively or in addition, a selector 182 may be coupled in electrical series with memristor 110.

After coupling memristor 110, method 300 may proceed to step 320, where a portion of memristor 110 is surrounded by thermally-insulating cladding 115. Step 320 may not necessarily occur after step 310, and may occur before or concurrent to step 310 in some examples. Surrounding may mean that thermally-insulating cladding 115 wholly surrounds memristor 100. Alternatively, thermally-insulating cladding 115 may surround memristor 110 and some or no other components. In some examples, thermally-insulating cladding 115 may include an air-gap 142 surrounding a portion of memristor 110. Alternatively or in addition, thermally-insulating cladding 115 may have a plurality of layers 162 forming interfaces 164 with an interfacial thermal resistance.

When an electrical stimulus, such as a voltage or a current, is applied to memristor device 100 to switch memristor device 100 or to determine its resistive state, heat may be released by portions of memristor device 100 due to joule heating. Joule heating, may occur when an electric current is passed through a material. Typically, a larger voltage creates a larger current through the material, which causes a larger amount of heat to be released. A notable exception to this behavior is certain types of selectors, including ones with negative differential resistance (NDR).

Figure 3B:
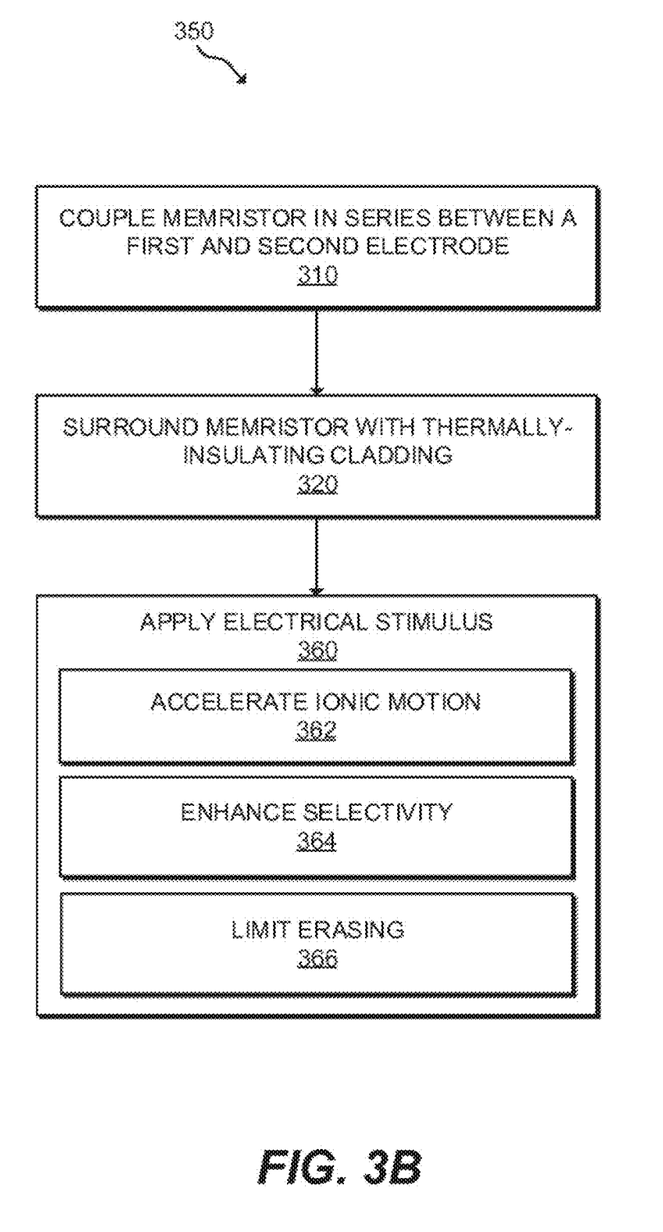
FIG. 3B is a flowchart of an example method for improving performance of a memristor where an electrical stimulus is applied to the memristor.

FIG. 3B is a flowchart of an example method 350 for improving performance of a memristor, which includes method 300 and step 360 for applying an electrical stimulus to memristor device 100. Step 360 may occur after step 310 and step 320. An electrical stimulus may be a voltage, current, or some other form of electrical stimulation. Applying an electrical stimulus to memristor device 100 may cause heat to be released due to joule heating of portions of memristive device 100, including memristor 110, first electrode 102, second electrode 104, and thermally insulating cladding 115.

In some implementations, step 360 may include sub-step 362 for accelerating ionic motion in memristor 110. As explained above, increasing the local temperature of memristor 110 may accelerate processes that drive ionic and electronic motion, such as diffusion, drift in an electric field, and thermophoresis in a temperature gradient. Since memristor 110 may include a channel whose electrical conductivity may be increased or decreased by moving ions or vacancies, accelerating ionic motion increases the speed with which the electrical conductivity of channels may be altered in memristor 110. Accordingly, generating heat from joule heating may accelerate ionic motion which may accelerate switching of memristor 110. Similarly, it may also increase the extent to which the ions or vacancies may be moved, enabling the formation of more resistive or more conductive states.

In addition or as an alternative, step 360 may include sub-step 364 for enhancing selectivity of memristor device 100 in a crossbar memory array. When a read, write, and/or erase voltage is applied to target a particular cell containing memristor device 100 in a crossbar array, the selected cell may initially release about four times as much heat power as half-selected cells because the dissipated joule heating power is proportional to the square of the applied voltage. Furthermore, if a cell's electrical resistance decreases with an applied voltage, as is usually the case with memristors such as memristor device 100, a selected cell may release more than four times the heat of a half-selected cell because dissipated power is inversely proportional to resistance. Furthermore, if the electrical resistance of memristor 110 decreases with increasing temperature, then the temperature rise may be further enhanced and the contrast in resistance between selected and half-selected cells may be improved. These effects may lead to a greater temperature rise in the selected cell than the half-selected cells. Because of the thermal insulation, this temperature rise may accelerate the switching process in the selected cells relative to the half-selected cells. These effects may benefit both writing and reading selectivity. During writing or erasing, the enhanced switching speed at elevated temperatures may favor switching the hot, fully selected cells over the cooler half-selected cells. When reading, the increased temperature and lower resulting resistance of a fully selected cell may, in some examples, increase the read signal relative to the sneak currents if the temperature coefficient of resistance is negative for both the on and off states.

In addition or as an alternative, step 360 may include sub-step 366 limiting erasing of memristor 110. Erasing may generally mean the process of switching memristor device 100 from a low resistance ("ON") state to a high resistance ("OFF") state. As explained above, the switching speed of memristor 100 of memristor device 110 may increase with increasing temperature. This may allow the use of voltages with an amplitude and duration that otherwise may not switch memristor 110. Due to thermal insulation provided by thermally-insulating cladding 115, first electrode 102, second electrode 104, interface 124, air-gap 142, and/or selector 182, power dissipated as a result of an applied voltage may heat memristor 110 to a temperature conducive to ionic motion and switching. Furthermore, because dissipated heat decreases as resistance increases, erasing may be limited when memristor 110 no longer reaches an adequate temperature for switching as a result of insufficient joule heating. In some examples, a voltage pulse, namely an intermittent voltage, may be applied to limit erasing of memristor 110.

The foregoing describes a number of examples for memristor devices with a thermally-insulating cladding. It should be understood that the memristor devices described herein may include additional components and that some of the components described herein may be removed and/or modified without departing from the scope of the memristor device. It should also be understood that the components depicted in the figures are not drawn to scale and thus, the components may have different relative sizes with respect to each other than as shown in the figures.

What is claimed is:

1. A memristor device, comprising:
   a first electrode;
   a second electrode;
   a memristor coupled in electrical series to the first electrode and to the second electrode; and
   a thermally-insulating cladding, wherein the thermally-insulating cladding surrounds at least a portion of the memristor and wherein at least one of the first electrode and the second electrode comprises a plurality of layers, the layers forming an interface with a thermal resistance.

2. The memristor device of claim 1, wherein switching speed of the memristor increases with increasing temperature of the memristor.

3. The memristor device of claim 1, wherein portions of the memristor device exhibits joule heating.

4. The memristor device of claim 1, wherein resistance of the memristor decreases with increasing temperature.

5. The memristor device of claim 1, wherein the first electrode and the second electrode each comprises a material selected from the group consisting of TiN, TaN, Ta2N, WN2, NbN, MoN, TiSi2, TiSi, Ti5Si3, TaSi2, WSi2, NbSi2, V3Si, electrically doped Si polycrystalline, electrically doped Ge polycrystalline, and combinations thereof.

6. The memristor device of claim 1, wherein at least one of the layers comprises an electrically insulating material and at least one electrical short.

7. The memristor device of claim 1, further comprising an air-gap surrounding at least a portion of the memristor.

8. The memristor device of claim 1, wherein the thermally-insulating cladding comprises a plurality of layers, the layers forming an interface with a thermal resistance between each layer and between the layers and the memristor.

9. The memristor device of claim 1, further comprising a selector coupled in electrical series to the memristor, wherein:
   the selector exhibits joule heating; and
   the thermally-insulating cladding surrounds at least a portion of the selector.

10. A computing device, comprising a memristor device, wherein the memristor device comprises:
    a memristor coupled in electrical series between a first electrode and a second electrode;
    a selector coupled in electrical series to the memristor; and
    a thermally-insulating cladding, wherein the thermally-insulating cladding surrounds at least a portion of the memristor and at least a portion of the selector and wherein at least one of the first electrode and the second electrode comprises a plurality of layers, the layers forming an interface with a thermal resistance.

11. A method for improving performance of a memristor, comprising:
    coupling the memristor in electrical series to a first electrode and to a second electrode; and
    surrounding at least a portion of the memristor with a thermally-insulating cladding;
    wherein applying an electrical stimulus to the memristor generates heat and wherein at least one of the first electrode and the second electrode comprises a plurality of layers, the layers forming an interface with a thermal resistance.

12. The method of claim 11, wherein applying an electrical stimulus accelerates ionic motion in the memristor via joule heating.

13. The method of claim 11, wherein applying an electrical stimulus enhances selectivity of the memristor device via joule heating.

14. The method of claim 11, wherein applying an electrical stimulus limits erasing of the memristor via joule heating.

* * * * *